United States Patent
Qian et al.

(10) Patent No.: US 7,600,177 B2
(45) Date of Patent: Oct. 6, 2009

(54) DELTA SYNDROME BASED ITERATIVE REED-SOLOMON PRODUCT CODE DECODER

(75) Inventors: Cheng Qian, San Jose, CA (US); Rajesh Juluri, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 497 days.

(21) Appl. No.: 11/053,292

(22) Filed: Feb. 8, 2005

(65) Prior Publication Data

US 2006/0179400 A1 Aug. 10, 2006

(51) Int. Cl.
*H03M 13/00* (2006.01)
(52) U.S. Cl. .................. 714/785; 714/755; 714/756
(58) Field of Classification Search .......... 714/785, 714/755, 756
See application file for complete search history.

(56) References Cited

U.S. PATENT DOCUMENTS

| | | | | |
|---|---|---|---|---|
| 5,844,920 A | * | 12/1998 | Zook et al. | 714/769 |
| 5,920,578 A | * | 7/1999 | Zook | 714/755 |
| 5,974,580 A | * | 10/1999 | Zook et al. | 714/755 |
| 5,991,911 A | * | 11/1999 | Zook | 714/758 |
| 5,996,105 A | * | 11/1999 | Zook | 714/755 |
| 6,047,395 A | * | 4/2000 | Zook | 714/756 |
| 6,052,815 A | * | 4/2000 | Zook | 714/758 |
| 6,192,499 B1 | * | 2/2001 | Yang | 714/785 |
| 6,363,511 B1 | * | 3/2002 | Massoudi | 714/755 |
| 6,738,942 B1 | * | 5/2004 | Sridharan et al. | 714/755 |
| 2007/0136641 A1 | * | 6/2007 | Juluri et al. | 714/769 |

OTHER PUBLICATIONS

"120mm DVD Read-Only Disk", Standard ECMA-267, 3rd Edition, Apr. 2001.
"Error-Erasure Correcting Reed-Solomon Decoder", Gupta et al., Digital Video Products Division, LSI Logic Corporation, Nov. 2, 1994.

* cited by examiner

*Primary Examiner*—Joseph D Torres
(74) *Attorney, Agent, or Firm*—Christopher P. Maiorana, PC

(57) ABSTRACT

A method for generating syndromes for a data block is disclosed. The method generally includes the steps of (A) calculating a plurality of row syndromes and a plurality of column syndromes for the data block arranged as a Reed-Solomon product code, (B) storing only the row syndromes and the column syndromes in a local memory, (C) in an alternating sequence (i)(a) decoding the column syndromes to generate column correction results and (b) updating the row syndromes in response to the column correction results and (ii)(a) decoding the row syndromes to generate row correction results and (b) updating the column syndromes in response to the row correction results.

19 Claims, 8 Drawing Sheets

DELTA SYNDROME BASED ITERATIVE REED-SOLOMON PRODUCT CODE DECODER

FIELD OF THE INVENTION

The present invention relates to a Reed-Solomon decoding generally and, more particularly, to a delta syndrome based iterative Reed-Solomon product code decoder.

BACKGROUND OF THE INVENTION

A Reed-Solomon Product Code (RSPC) block 80 use rows and columns to encode an array of data bytes. In a DVD application, 172×192 bytes of data are encoded by adding sixteen bytes 82 (i.e., PO) in each column and ten bytes 84 (i.e., PI) in each row to form the final RSPC code 80 of 182×208 bytes, as shown in FIG. 1. To better decode an RSPC block 80, iterative methods are conventionally used to decode by row and column and then by row and column again until either no more errors exist in the code or a best resulting code is established.

Each iteration is capable of changing up to all of the data bytes in the RSPC block 80 and update the decoding results in response to the changes. The ability to change the data commonly means that either the data block is saved locally or a lot of bandwidth is used moving the data back and forth from an external memory over a memory bus. Conventional decoding methods access each of the data bytes multiple times during processing. For example, after finishing decoding of a particular row, some of the data bytes in the particular row are often updated to correct errors found by the decoding. Therefore, when column decoding begins, column corrections are calculated based on partially corrected data. A next iteration of row decoding uses the partially corrected data from the previous column decoding, and so on.

As each decoding step processes a row or column, either the data bytes are saved locally until the iterations are complete or the data bytes are accessed across the memory bus in time for the associated row or column decode. Storing all of the data bytes locally results in a large local memory (i.e., 182 columns×208 rows×2 copies=75,712 bytes). Storing all of the data bytes in an external memory consumes a large amount of a memory bus bandwidth.

SUMMARY OF THE INVENTION

The present invention concerns a method for generating syndromes for a data block. The method generally comprises the steps of (A) calculating a plurality of row syndromes and a plurality of column syndromes for the data block arranged as a Reed-Solomon product code, (B) storing only the row syndromes and the column syndromes in a local memory, (C) in an alternating sequence (i)(a) decoding the column syndromes to generate column correction results and (b) updating the row syndromes in response to the column correction results and (ii)(a) decoding the row syndromes to generate row correction results and (b) updating the column syndromes in response to the row correction results.

The objects, features and advantages of the present invention include providing a method and/or architecture for a delta syndrome based iterative Reed-Solomon product code decoding that may (i) use a small amount of local memory, (ii) consume a small bandwidth of a memory bus, (iii) provide a fast decoding compared to conventional approaches and/or (iv) provide a unified memory access structure that reduces system cost compared to conventional designs.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Reed-Solomon codes are generally used in Digital Versatile Disk (DVD) and Compact Disk (CD) applications. The Reed-Solomon codes are based on Galois Field (GF) codes. The GF codes may be implemented with a primitive polynomial of $x^8+x^4+x^3+x^2+1$ with an 8-bit (e.g., a byte) element. A generator polynomial is generally expressed as follows:

$$g(x)=(x+a^0)(x+a^1)(\ldots)(x+a^{R-1}) \qquad \text{Eq. (1)}$$

where R may be a number of parity bytes for the code and "a" may be a root of the primitive polynomial. A listing of common applications of the Reed-Solomon codes is provided in Table I as follows:

TABLE I

| Application | N | K | R |
| --- | --- | --- | --- |
| DVD PI | 182 | 172 | 10 |
| DVD PO | 208 | 192 | 16 |
| CD C1 | 32 | 28 | 4 |
| CD C2 | 28 | 24 | 4 |
| CD P | 26 | 24 | 2 |
| CD Q | 45 | 43 | 2 |

The variable N may identify a total number of bytes in a row or column of the code, K may identify a total number of data bytes in the rows or columns and R=N−K. For an information packet of K bytes (e.g., $B_0, B_1, B_2, \ldots, B_{K-1}$), parity bytes (e.g., PI and/or PO) may be generated as follows:

$$P(x)=(B_0 x^{K-1}+B_1 x^{K-2}+B_2 x^{K-3}+\ldots+B_{K-2}x+B_{K-1})x^R \mod g(x) \qquad \text{Eq. (2)}$$

As such, an encoded code word may be generated as follows:

$$C(x)=B_0 x^{N-1}+B_1 x^{N-2}+B_2 x^{N-3}+\ldots+B_{N-2}x+B_{N-1} \qquad \text{Eq. (3)}$$

Figure 1:
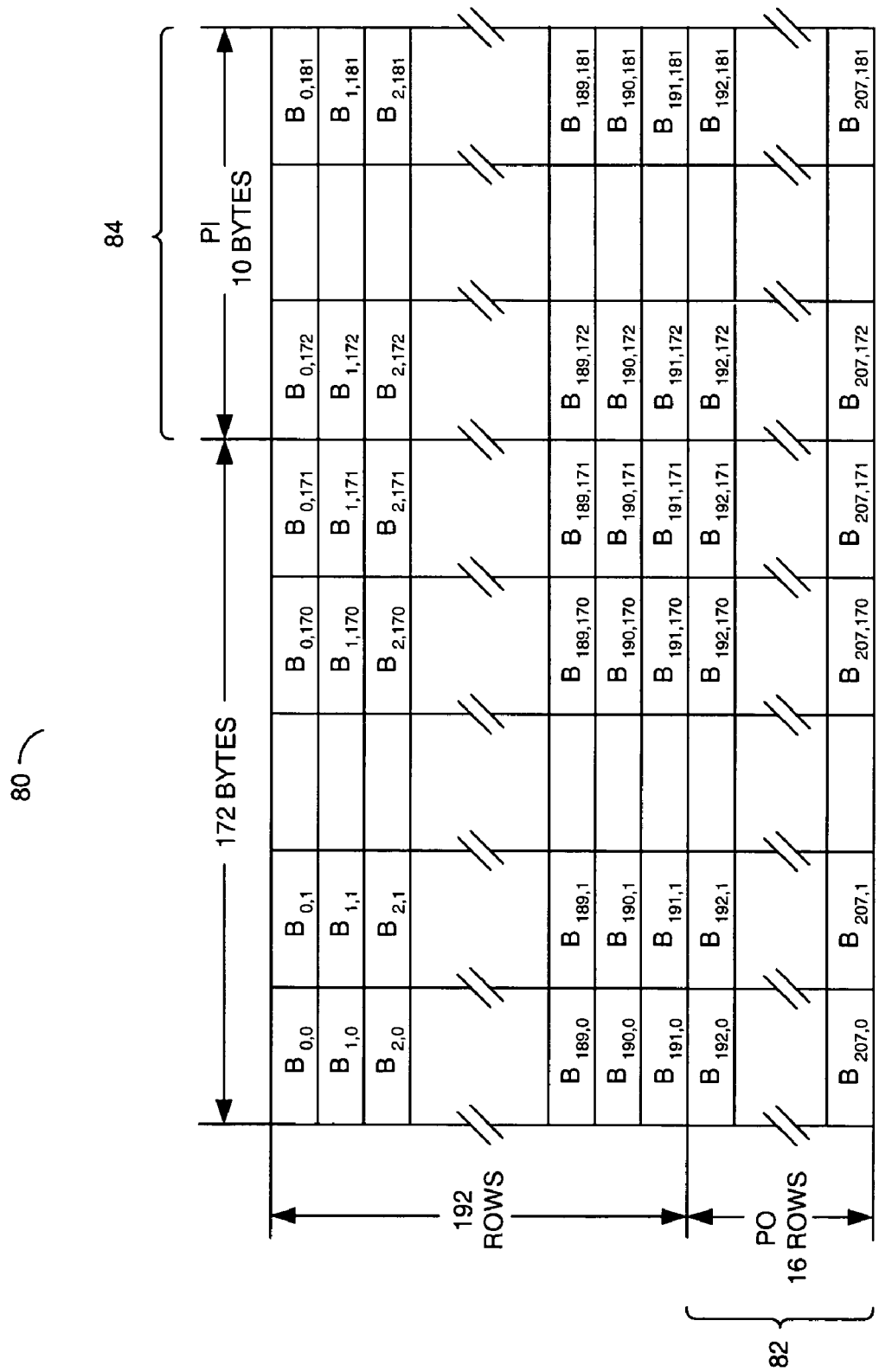
FIG. 1 is diagram of a conventional Reed-Solomon product code for digital video.
Figure 2:
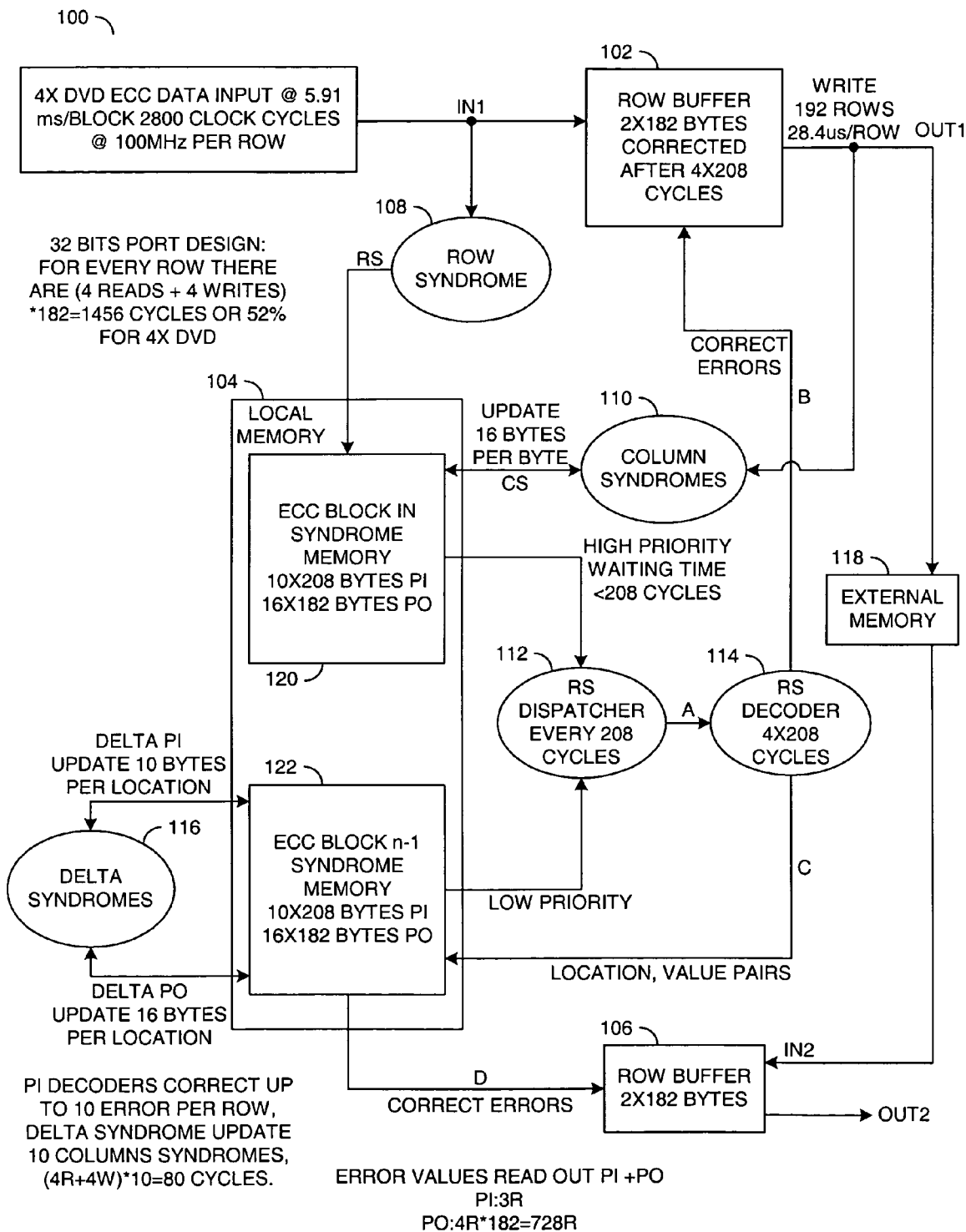
FIG. 2 is a block diagram of an example implementation of a circuit in accordance with a preferred embodiment of the present invention.

Referring to FIG. 2, a block diagram of a block diagram of an example implementation of a circuit 100 is shown in accordance with a preferred embodiment of the present invention. The circuit (or system) 100 generally comprises a circuit (or module) 102, a circuit (or module) 104, an optional circuit (or module) 106, a circuit (or module) 108, a circuit (or module) 110, a circuit (or module) 112, a circuit (or module) 114 and a circuit (or module) 116. The circuit 100 may receive an input signal (e.g., IN1) at the circuit 102 and the circuit 108. An output signal (e.g., OUT1) may be generated by the circuit 102. The circuit 106 may receive another input signal (e.g., IN2). An output signal (e.g., OUT2) may be generated by the circuit 106. If the optional circuit 106 is not implemented, the circuit 100 may generate an output signal (e.g., D).

The signal IN1 may be arranged as a sequence of DVD RSPC blocks. The blocks may have a transfer rate of 5.91 milliseconds per block at a 4× speed. Processing of each row within the signal IN1 may be achieved in one implementation within 2800 clock cycles of a 100-megahertz clock. Each byte of data in the signal IN1 may be received by the row buffer circuit 102 and the row syndrome module 108 as a 9-bit unit every 15.4 clock cycles.

The circuit 100 may be operational to perform a delta syndrome based decoding method. The delta syndrome based decoding method generally saves only syndromes for rows and columns of a Reed-Solomon Product Code (RSPC) Error Correction Code (ECC) block (e.g., 80) in the local memory circuit 104. An iterative (alternating) decoding may be applied to delta syndrome changes by the delta syndrome module 116. After the iterative decoding completes, error correction results may be available in the local memory circuit 104 to correct the data received in the RSPC. As such, (i) a local memory size may be reduced to a fraction of a size for a conventional decoder and (ii) a memory access bandwidth utilization may be reduced to a minimum. The minimum memory access bandwidth generally makes possible an implementation of a unified memory access structure interface to the circuit 100.

The delta syndrome based decoding generally does not update the data received in the RSPC block 80 during the iterative decoding. Instead, results of the iterative decoding may be compressed and saved locally and then applied to the data afterwards. For example, the results of the iterative decoding may be stored in the circuit 104 in place of syndrome information.

The delta syndrome module 116 may be operational to update the column syndromes directly. A resulting effect on the column syndromes may be similar to conventionally updating the data and then recalculating the column syndromes. The RS decoder module 114 may be operational to row/column decode the row/column syndromes stored in the local memory circuit 104. The delta syndrome module 116 may be further operational to update the column/row syndromes based on the results of the row/column decoding conveyed in a signal (e.g., C).

When the circuit 100 receives a block of data in the signal IN1, the row syndrome module 102 may calculate the row syndromes. The row syndromes may be transferred in a signal (e.g., RS) to the local memory circuit 104 and saved.

The RS dispatcher module 112 may be operational to select each row syndrome shortly after being saved in the local memory circuit 104 and provide the selected row syndrome to the RS decoder module 114. In one embodiment, each newly generated row syndrome may be read from the local memory circuit 104 by the RS dispatcher module 112 in less that 208 clock cycles.

The RS decoder module 114 may be operational to generate row error correction data by decoding the row syndromes. The row error correction data may be transferred in a signal (e.g., B) to the row buffer circuit 102. The RS decoder module 114 may be arranged as a pipeline structure having a depth of 208 clock cycles. The pipeline may have 3 stages of 208 cycles each.

Dynamic control of the RS decoder module 114 may be independent of a first pass (e.g., pass 1) and a second pass (iterative decoding) (e.g., pass 2) of the decoding. A 10-bit identification (e.g., rs_id) may be used in the pipeline generally comprising (i) "00+row" for pass 1, (ii) "01+column" for pass 2 PO decoding, (iii) "10+row" for pass 2 PI decoding and (iv) "11+0xff" for an idle slot. The identification "00" generally has a highest priority and may be used for pass 1 work. Identification "00" jobs may wait less than 208 cycles before being processed by the RS decoder module 114. A pass 2 job may be cancelled if a "00" job takes the slot. Identifications "01" and "10" have a second priority. A "01" job or a "10" job may be cancelled by a "00" job. As such, checks may be performed to see if "01" jobs or "10" jobs go completely through the pipeline. If a job is cancelled, the RS decoder module 114 may read the cancelled job again from the local memory circuit 104. Reading syndromes from the local memory circuit 104 generally has the lowest priority among memory accesses. An identification of "11" may be considered an idle slot indicating that no pass 1 or pass 2 jobs may be ready for decoding.

The RS decoder module 114 may process a received job within 208 cycles. The result of the processing may be sent to different process logic based on the "mode" and the identifications "00", "01", "10" and "11". The row buffer circuit 102 may record all the information from the results generated by the RS decoder module 114. The row buffer circuit 102 may use the recorded information to correct errors in the data block rows during the first pass. The RS decoder module 114 may also be operational to organize the error values generated by the decoding and save the error values in the local memory circuit 104. Updating one or more Bit Error Rate (BER) counters may be performed by the RS decoder module 114. Furthermore, the RS decoder module 114 may record uncorrectable rows by a row identification number and uncorrectable columns by a column identification number.

The row buffer circuit 102 may be operational to buffer up to two full rows of the RSPC block 80 at any given time. The row buffer circuit 102 may be further operational to apply the row error correction information received in the signal B to the data as buffered. The corrected data may be presented external to the circuit 100 and to the column syndrome module 110. In one embodiment, the correction of the buffered data may be performed after 4×208 clock cycles. The data transfers to the external memory 118 may be performed as 192 row writes at 28.4 microseconds per row. The data may also be transferred to the column syndrome module 110 as a 182-byte set.

The column syndrome module 110 may be operational to calculate the column syndromes substantially simultaneously with the syndrome module 108 calculating the row syndromes. The column syndromes may be transferred in a signal (e.g., CS) to the local memory circuit 104 and saved. The local memory circuit 104 may only save the row syndromes and the column syndromes of the RSPC block 80, but not the data from the signal IN1. The data block in the signal IN1 may be transferred by the row buffer circuit 102 external to the circuit 100 in the signal OUT1. An external memory circuit 118 may hold the data block outside the circuit 100 until ready for further processing.

The column syndrome calculation may be completed after the entire RSPC block 80 has been received by the row buffer circuit 102. The RS dispatcher module 112 may dispatch row syndromes or column syndromes periodically (e.g., every 208 clock cycles) to the RS decoder module 114. The RS decoder module 114 may generate location and error value pairs based on the syndrome being decoded. The location and error value pairs may be transferred by a signal (e.g., C) to the local memory circuit 104 and saved.

The delta syndrome module 116 may be operational to perform the RSPC iterative decoding from row to column and column to row. During row-to-column and column-to-row switches, the delta syndrome module 116 may be used to update the appropriate syndromes. After the iterations reach a predefined limit or there are no more errors detected in the code, the iterating may be stopped. After the iterating is stopped, the decoding results may be save locally in place of syndrome. The decoding results may thus be available in the signal D for correcting the data block stored in the external memory circuit 118.

The iterative decoding is generally based only on delta syndromes. The decoding results may not be presented until the iterating has finished. Therefore, correcting of the data block may be delayed until all of the decoding is done and the error location and error value information may be saved in place of the syndromes. As such, usage of the local memory circuit 104 may be small. The one embodiment, the PI decoding may allow for correction of up to 10 errors per row. A delta syndrome update to the 10 column syndromes may involve 4 reads and 4 writes for each of the 10 columns using 80 cycles.

The local memory circuit 104 generally comprises a first block (or module) 120 and a second block (or module) 122. Each of the blocks 120 and 122 may be used in decoding one RSPC block 80 at a time. Utilizing two memory blocks 120 and 122 generally permits the circuit 100 to start working on a subsequent RSPC block 80 (e.g., a block n) while calculations for a prior RSPC block 80 (e.g., a block (n−1)) may be in progress.

The memory blocks 120 and 122 may be configured to store 9 bits per byte of information, save syndromes and save error location pairs. The syndrome data and the error location pairs may be distinguished by a most significant bit (MSB). Where MSB=0, the information may represent a syndrome. Where MSB=1, the information may be an error location pair.

The memory blocks 120 and 122 may provide for separate (i) erasure based results and (ii) none-erasure based results. The erasure based results may be saved in a low address range without location. Locations may be common for all the rows or columns saved in a table. The error location pairs may be saved in a top address range with location bytes MSB=1. The memory blocks 120 and 122 may also record erasure degrees used in the RS decoder module 114.

For a DVD application, conventional methods utilize 80 kilobytes (Kbytes) of local memory whereas the circuit 100 may utilize a total of about 10 Kbytes. Furthermore, since the data block is only written once and read once from the external memory 118, a memory bandwidth supported by a bus carrying the signal OUT1 from the row buffer circuit 102 to the external memory circuit 118 may operate at only twice a data rate of the RSPC block 80. In addition, the circuit 100 may provide fast decoding compared to conventional methods, because each RS code is started from 10 or 16 bytes of syndrome instead of 182 or 208 bytes of data. Finally, implementation of the unified memory access structure generally reduces total system cost.

The delta syndrome decode method may be described as a two-pass method, as mentioned above. In the first pass (e.g., pass 1), initial row syndromes and initial column syndromes may be generated and stored in the local memory circuit 104. In the second pass (e.g., pass 2), the iterative decoding of the syndromes may be used to update the stored syndromes.

Figure 3:
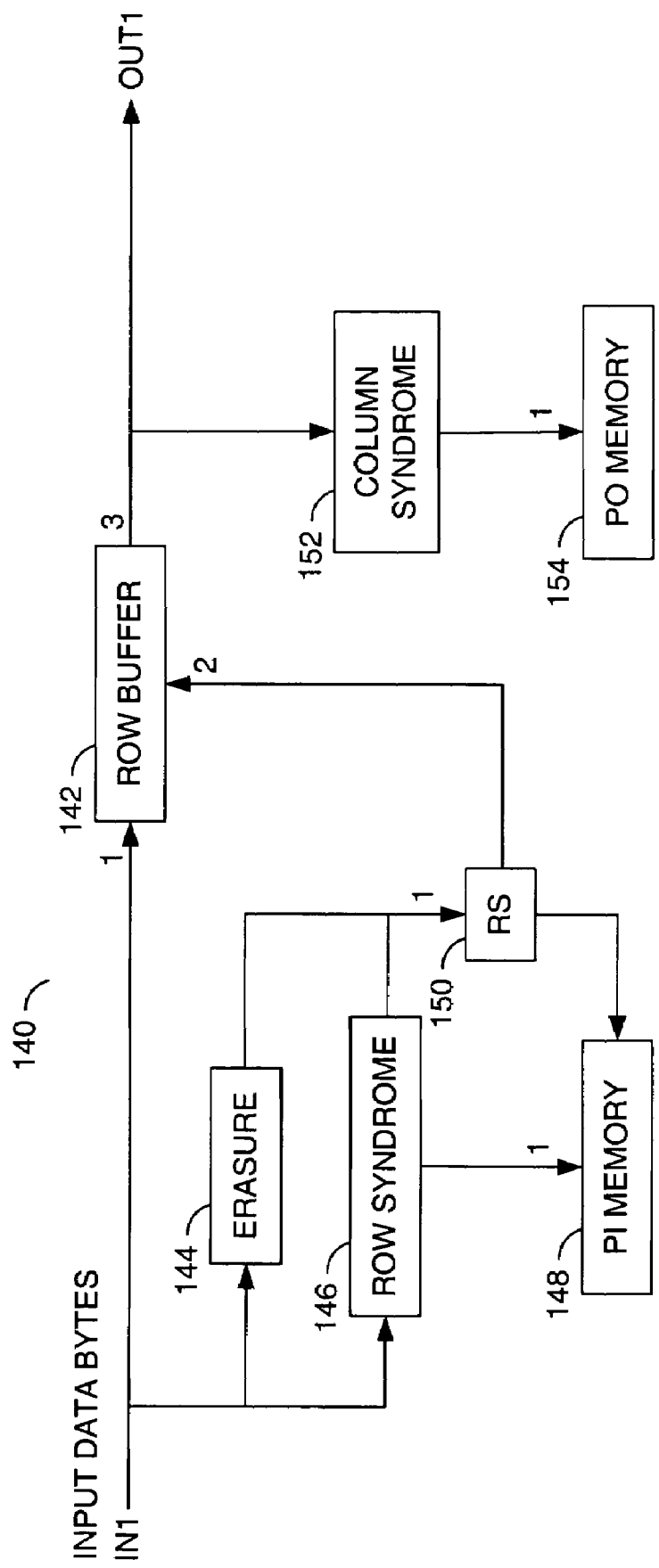
FIG. 3 is a block diagram of an example functional flow of a first pass.

Referring to FIG. 3, a block diagram of an example functional flow 140 of a first pass is shown. The function flow 140 generally comprises a step (or module) 142, a step (or module) 144, a step (or module) 146, a PI memory block (or module) 148, a step (or module) 150, a step (or module) 152 and a PO memory block (or module) 154. The signal IN1 may provide input data to the flow 140. The signal OUT1 may be presented as an output by the flow 140. The PI memory block 148 and the PO memory block 154 may reside in the local memory 104.

The first pass generally starts with a reception of the data block in the signal IN1 from an eight-to-fourteen demodulation (not shown). The data may be received as a byte of information within a 9-bit package, with the most significant bit acting as an erasure flag. In one embodiment, a minimum time between bytes may be 12 clock cycles.

The first pass may include calculating the row syndromes from the data block in the step 146 and calculating erasure locator polynomials from the data block in the step 144. The row syndromes may be stored in the PI memory block 148. The data block may be subject to a row buffering 142 (e.g., row buffer 102).

The row syndromes and the erasure locator polynomials may be provided to a decoding 150. The decoding 150 (e.g., RS decoder 114) may operate on the received row syndrome to generate a result. The result may include row correct error information. The row buffer 142 may use the row error corrections to update the data block prior to presenting the data block in the signal OUT1. Since the detected errors may have been corrected, an appropriate row in the PI memory block 148 may be reset to zero as an indication that no errors were detected and/or corrected. Otherwise, the row may be marked as uncorrectable. As the data block is presented (e.g., at 1 byte per 8 clock cycles) to an interface (e.g., a Stream Data interface Plus (SDP)), the column syndromes may be calculated in step 152 and saved in the PO memory block 154.

Figure 4:
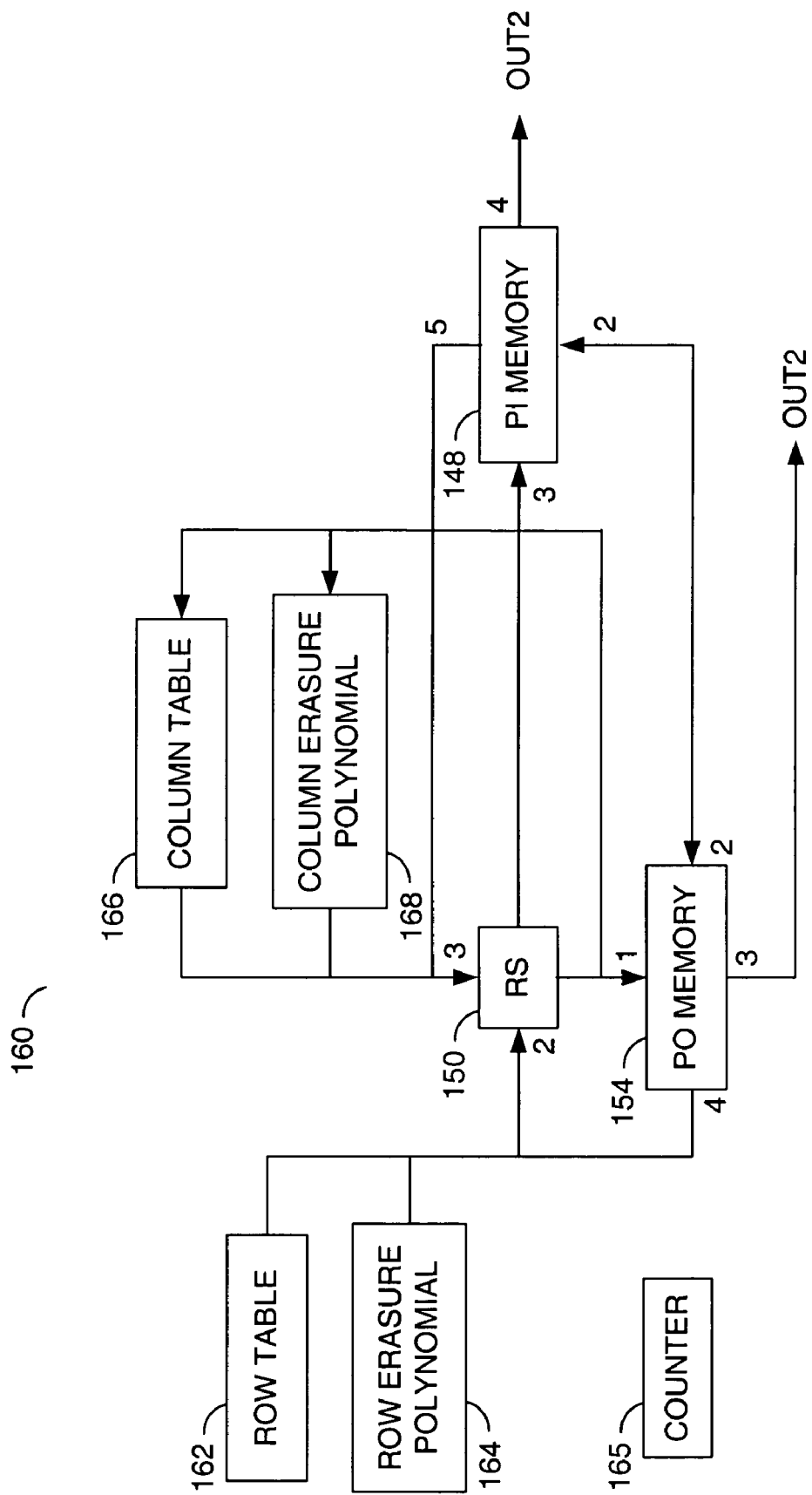
FIG. 4 is a block diagram of functional flow of a second pass.

Referring to FIG. 4, a block diagram of an example functional flow 160 of a second pass is shown. The second pass generally comprises the PI memory block 148, the decoding block 150, the PO memory block 154, a row table block (or module) 162, a step (or module) 164, a step (or module) 165, a step (or module) 166 and a column table step (or module) 168.

The second pass may start after receiving all of the data block and one extra row time to process the last row. Iteration counters may then be reset and row erasure locator polynomial may be calculated by the step 164. A column syndrome may then be read from the PO memory block 154. If the column syndrome is zero, a next column may be considered. Once a non-zero column syndrome is found, the non-zero column syndrome may be provided to the decoding step 150 (e.g., RS decoder 114). The decoding generally provides results back to the PO memory block 154 and the PI memory block 148. The delta syndromes may be calculated for the respective rows and the row syndromes may be updated accordingly. The updated syndromes may be saved back into to PI memory block 148.

The row syndrome may be read from PI memory block 148. If a particular row syndrome is zero, a next row syndrome may be checked. If not, a decoding job for the particular row syndrome may be set to the decoding step 150. The decoding step 150 generally returns results. The results may be used to calculate the column delta syndromes. Afterwards, the updated column syndromes may be saved in the PO memory block 154 and the row marked as decoded.

Iterations may continue with the columns again until an iteration counter 165 is met or erasure decoding is used once. After the iterations have completed, a done signal may be presented and a check of a ready signal may be performed. The second pass may continue with organizing data from the PI/PO memories 148/154 in row order which may then be sent to the SDP when the ready signal is in a ready state. After all of the error correction data is sent out, (i) an end signal may be generated, (ii) the error counter registers may be updated and (iii) the process waits for a next RSPC block 80.

Calculate Erasure Polynomial: If an erasure is flagged at location j within the code word, then $a^{-j}$ may be a root of an erasure locator polynomial (e.g., PER). The erasure locator polynomial PER may be expressed as follows:

$$PER = (x+a^{-j1})(x+a^{-j1}) \ldots (x+a^{-je}) \quad \text{Eq. (4)}$$

Note that the location j is generally labeled different in DVD specifications and papers as compared to Reed-Solomon papers. In the DVD documentation, a first byte is commonly labeled as "0" and a last byte as "N−1". In Reed-Solomon coding papers, a GF(256) code should be N=255 bytes length, thus a first byte is commonly labeled "254" and a last byte is labeled "0". Any N less than 255 may be called a shortened code. The parity R bytes are generally the last R bytes of the code. For a case of DVD PO code of N=208, a location of the first byte may be 207. If there is an error at the first byte, the location may be referred to as $a^{-207}$.

Reading the DVD data in the first pass may include generating an erasure locator polynomial. Let "d" be a degree of the erasure locator polynomial PER, where d<=10. At most d=10 so the polynomial may have 11 items as follows:

$$PER = er_0 x^{10} + er_1 x^9 + er_2 x^8 + \ldots + er_{10} x^0 \quad \text{Eq. (5)}$$

For any degree d, the erasure locator polynomial may be expressed as follows:

$$PER = er_0 x^d + er_1 x^{d-1} + er_2 x^{d-2} + \ldots + er_d x^0 \quad \text{Eq. (6)}$$

Starting from d=0:

$$PER = er_0 x^0, \text{ where } er_0 = 1 \quad \text{Eq. (7)}$$

Calculate new erasure polynomial (e.g., $PER_{new}$):

$$PER_{new} = PER^*(x+a^{-j}), \text{ where j is a byte locator} \quad \text{Eq. (8)}$$

For byte 0 in the data stream, a value of j may equal 181. Thereafter, $a^{-j}$ may be updated for every byte received as follows:

$$a^{-(j+1)} = a^{-j} * a^{-1} \quad \text{Eq. (9)}$$

If MSB=0, no erasure may be performed for the byte. If MSB=1,

PER may be updated as follows:

$$\begin{aligned} PER_{new} &= Per * (x + a^{-j}) \\ &= (er_0 x^d + er_1 x^{d-1} + er_2 x^{d-2} + \ldots + er_d x^0) * (x + a^{-j}) \\ &= er_0 x^{d+1} + (er_0 * a^{-j} + er_1) x^d + (er_1 * a^{-j} + er_2) x^{d-1} + \ldots + \\ &\quad (er_{d-1} * a^{-j} + er_d) x^1 + er_d * a^{-j} x^0 \end{aligned} \quad \text{Eq. (10)}$$

Figure 5:
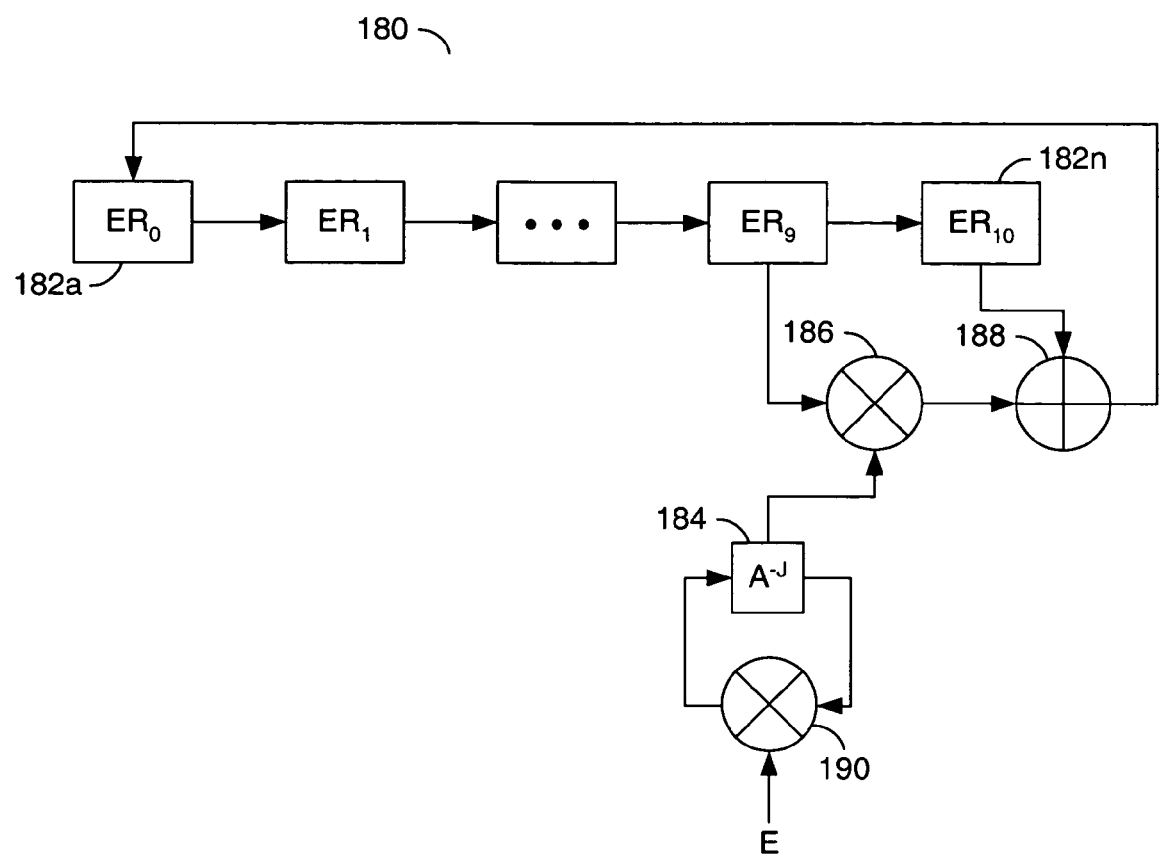
FIG. 5 is a block diagram of a circuit for generating an error locator polynomial.

Referring to FIG. 5, a block diagram of an example implementation of a circuit 180 for generating the error locator polynomial PER is shown. The circuit (or module) 180 generally comprises multiple registers 182a-182n, a register 184, a multiplier 186, and adder 188 and a multiplier 190. The registers 182a-182n may be connected in series with the last two registers 182(n−1) and 182n having outputs connected to inputs of the multiplier 186 and the adder 188, respectively. An output of the multiplier 186 may be connected to a second input of the adder 188. An output of the adder 188 may be connected to an input of the first register 182a. An output of the register 184 may be connected to a second input of the multiplier 186 and an input of the multiplier 190. A second input of the multiplier 190 may receive a signal (e.g., E). An output of the multiplier 190 may be connected to an input of the register 184. Other designs of the circuit 180 may be implemented to meet the criteria of a particular application.

Calculate Syndromes: For a Reed-Solomon (RS) code word of (N, K), where N is a code word length in bytes and K is a number of information bytes, an R number of syndromes may be calculated by evaluating R number of roots of the polynomial g(x). Assume the received code word is shown in equation 3 above, then:

$$s_0 = C(a^0), s_1 = C(a^1), \ldots, s_{R-1} = C(a^{R-1})$$

The syndrome polynomial is generally expressed as follows:

$$s(x) = s_{R-1} x^{R-1} + s_{R-2} x^{R-2} + \ldots + s_1 x + s_0 \quad \text{Eq. (11)}$$

Figure 6:
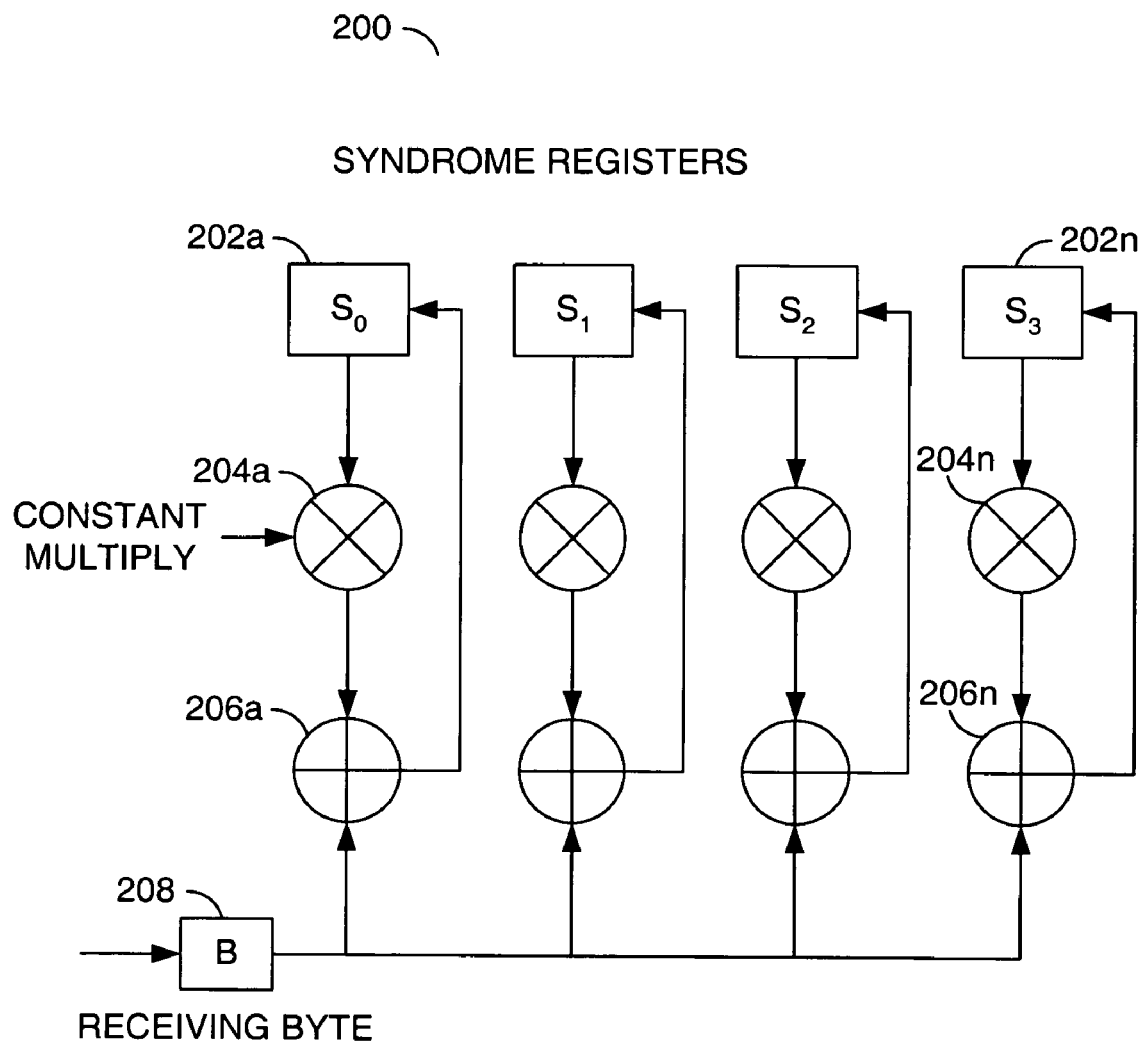
FIG. 6 is a block diagram of a circuit for generating syndromes.

Referring to FIG. 6, a block diagram of an example implementation of a circuit 200 for generating the syndromes is shown. The circuit 200 generally comprises multiple register 202a-202n, several multipliers 204a-204n, several adders 206a-106n and a register 208. An output of the register 208 may be connected to one input of each of the adders 206a-206n. A second input to each adder 206a-206n may be connected to an output of a respective multiplier 204a-204n. An output of each adder 206a-206n may be connected to an input of a respective register 202a-202n. An input to each of the multipliers 204a-204n may receive a multiplication constant. A second input of each multiplier 204a-204n may be connected to an output of a respective register 202a-202n.

Figure 7:
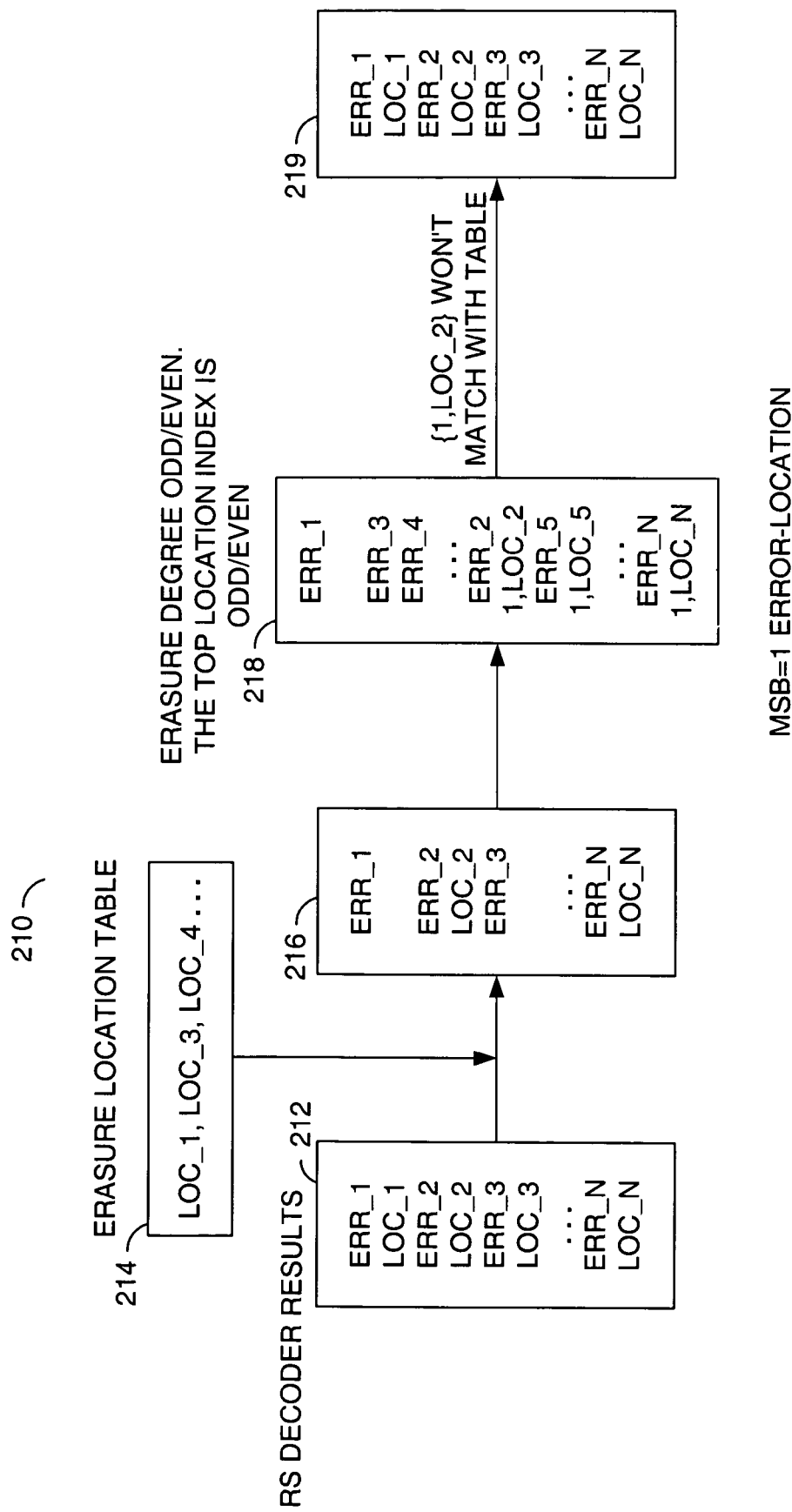
FIG. 7 is a block diagram of an example method to save Reed-Solomon decoding results in place of syndrome results.

Referring to FIG. 7, a block diagram of an example method 210 to save Reed-Solomon decoding results in place of syndrome results is shown. The method 210 generally comprises a step (or module) 212, a step (or module) 214, a step (or module) 216, a step (or module) 218 and a step (or module) 219.

The Reed-Solomon (RS) decoder is generally capable of correcting a number (e.g., v) of errors and a number (e.g., e) erasures for 2v+e≦R, 0≦v≦(R/2) and 0≦e≦R, where R is a redundancy of the code. If a particular number of errors (e.g., n) may be corrected by the RS decoder, then n=v+e≦R. An error correction may be stored in a location of 2 bytes, so n error corrections may be stored in a total of 2n bytes. One byte may store a location and the other byte may store a correction. A value of 2n may be greater than R, however, there may be only R bytes available in the syndrome memory (e.g., 120 or 122) for use. Since the erasure flagged errors generally share the same locations for all the rows or columns, two common tables may be used to share the locations, one for row locations and one for column locations. Only the actual error value may be stored in the memory. Therefore, the results may use 2v+e≦R locations, that may fit in the R bytes of memory. The final decoding results may be stored by placing erasure flagged results in a lower part of memory. The common location values may be withheld from the memory while the associated error values may be saved. The most significant bit (e.g., bit 9) of unique locations values may be set to a logical one to signify non-erasure correction results. A logical one 9th bit may help restore the compressed results back into an original format.

The RS decoder circuit 114 may generate n location values and n error values (e.g., LOC_x and ERR_x, where 1≦x≦n) results in step 212 for a total of 2n items (with each item represented as 9 bits). The results generally include common erasure locations in an erasure location table in step 214. Where the location results and erasure locations match (for example LOC_1, LOC_3 and LOC_4), the method 210 may remove the location results from the results in step 216 to reduce (compress) the amount of information to be stored (e.g., less than 2n items). The location value and error value results may then be sorted such that error values with locations already in the erasure location table (e.g., MSB=0) are grouped together (see for example ERR_1, ERR_3 and ERR_4) and error values with unique location values (e.g., MSB=1) are grouped together (see for example, LOC_2, LOC_5, . . . , LOC_n). The sorted data produced in step 218 may be saved in the local memory 104. Step 219 may restore the data to the original format (e.g., shown in step 212) by combining the common location values in the erasure location table with the values read from the local memory 104. The restored data may contain the original n location values and the original n error values, for a total of 2n items.

Figure 8:
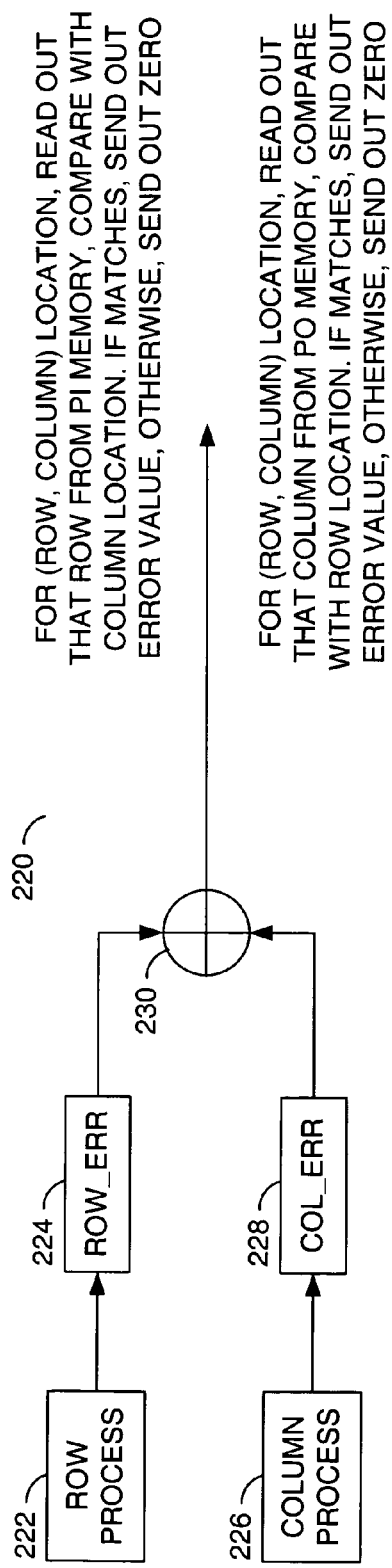
FIG. 8 is a block diagram of an example method for combining row and column corrections results.

Referring to FIG. 8, a block diagram of an example method 220 for combining row and column corrections results is shown. The method generally comprises a step (or module) 222, a step (or module) 224, a step (or module) 226, a step (or module) 228 and a step (or module) 230.

The RSPC code generally has row RS parity check bytes and column RS parity check bytes. The errors may be corrected along the rows, along the columns, or a combination of both. In a draft condition, the correction results may be stored in a compressed format in place of syndrome memories. The final results may be presented in a streaming row format (e.g., row 0, row 1, . . . , row 207), where each row generally has 172 correction bytes. A correction value of zero may mean that the corresponding location is correct and thus no correction may be performed. The non-zero correction bytes and the received bytes may undergo a logical operation (e.g., XOR) to restore the corresponding original values.

Two processes may be used to read the compressed results from the memories, a row process in step 222 and a column process in step 226. Each process may generate in steps 224 and 228 a set or stream of correction bytes with inserted zeros for locations not needing corrections. The streams from the two processes may be logically combined in step 230 (e.g., XOR) and presented as the final results. By utilizing both row correction codes and column correction codes, data bytes mis-corrected by one code may be fixed by the other.

Syndrome calculation: The syndrome calculations may be defined by equations 3 and 11, as follows:

$$C(x)=B_0x^{N-1}+B_1x^{N-2}+B_2x^{N-3}+\ldots+B_{N-2}x+B_{N-1} \quad \text{Eq. (3)}$$

$$s(x)=s_{R-1}x^{R-1}+s_{R-2}x^{R-2}+\ldots+s_1x+s_0 \quad \text{Eq. (11)}$$

Where $s_0=C(a^0)$, $s_1=C(a^1)$, . . . , $s_{R-1}=C(a^{R-1})$. If $B_j$ is corrected from row/column decoding, new syndrome for the column/row calculations may be expressed in terms of an error correction value $e_j$ as follows:

$$C_{new}(x)=B_0x^{N-1}+B_1x^{N-2}+\ldots+(B_j+e_j)x^{N-j-1}+\ldots+B_{N-2}x+B_{N-1} \quad \text{Eq. (12)}$$

$$s_{newi}=C_{new}(a^i)=C(a^i)+e_ja^{i(N-j-1)}=s_i+e_ja^{i(N-j-1)} \quad \text{Eq. (13)}$$

The term $e_ja^{i(N-j-1)}$ in equation 13 is generally the delta syndrome. The $e_j$ from the RSPC row correction may be used to calculate the delta syndromes for columns. For an example row j, DVD RSPC code j from 0 to 207 may be decoded by the RS decoder 114 resulting in n errors corrected. The n errors from a column point of view may affect the syndromes in n columns, one row correction per each of the n columns. The corrections may happen for each byte $B_j$ shown in equation 12 because all of the n correction may be from the same row j. If $e_j$ is the correction for one column of the n columns, the delta syndrome term in equation 13 may apply the current syndrome to reflect the correction that happened in row j. Generally, R bytes of column syndromes $s_i$ (where i=0, . . . , R−1) may be generated and each may be applied with the delta syndrome term $e_ja^{i(N-j-1)}$. The term $e_j$ form RSPC column correction may be used to calculate the delta syndrome for rows.

Figure 9:
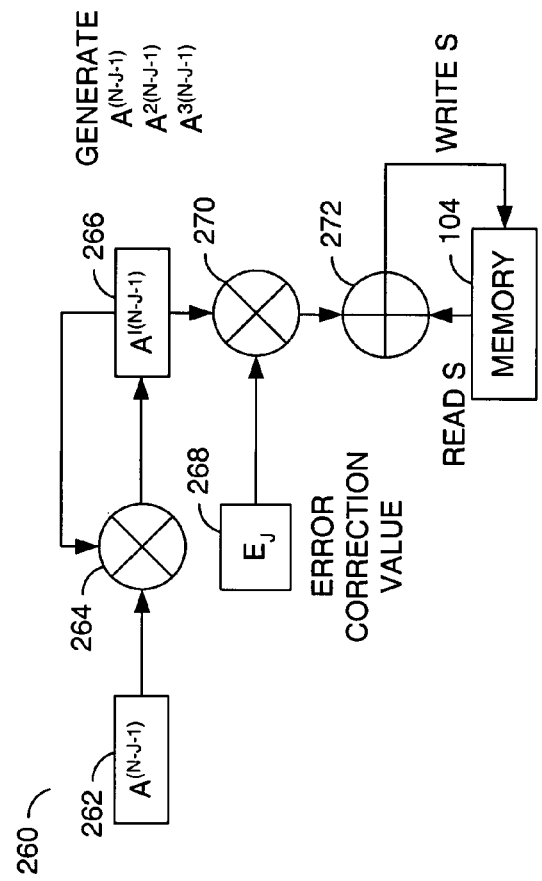
FIG. 9 is a block diagram of an example implementation of a circuit for generating a delta syndrome.

Referring to FIG. 9, a block diagram of an example implementation of a circuit 260 for generating a delta syndrome is shown. The circuit 260 generally comprises a register 262, a multiplier 264, a register 266, a register 268, a multiplier 270, an adder 272 and the local memory circuit 104. The multiplier 264 may receive an input from each of the registers 262 and 266. An output of the multiplier 264 may be connected to an input of the register 266. The multiplier 270 may receive an input from each of the registers 266 and 268. An output of the multiplier 270 may be connected to an input of the adder 272. A second input to the adder 272 may be provided in a read from the memory 104. An output of the adder 272 may be written back into the memory 104. The "READ S" phrase generally means to read current syndromes from the local memory 114. The "WRITE S" phrase generally means to write back into the local memory 104 the new syndromes, starting from i=0 to i=R−1, such that all R syndromes are updated.

The function performed by the flow diagrams of FIGS. 3 and 4 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A method to correct a first block of first data, comprising the steps of:
    (A) calculating a plurality of first row syndromes from said first block arranged as a Reed-Solomon product code;
    (B) calculating row error correction information by decoding said first row syndromes;
    (C) applying said row error correction information to said first data as stored in a first buffer, wherein said first buffer holds at most a first fraction of said first block;
    (D) calculating an initial set of values of a plurality of first column syndromes from said first block as read from said first buffer after said row error correction information has been applied;
    (E) storing both said first row syndromes and said first column syndromes in a local memory, wherein said first data is excluded from said local memory;
    (F) decoding in a sequence alternating between a first pass and a second pass, wherein (i) said first pass comprises decoding using only said first column syndromes to generate column correction results and (ii) said second pass comprises decoding using only said first row syndromes to generate row correction results;
    (G) updating (i) said first row syndromes in response to said column correction results and (ii) said first column syndromes in response to said row correction results;
    (H) generating both a plurality of row corrections and a plurality of column corrections in response to said first row syndromes and said first column syndromes;
    (I) generating corrected data by correcting said first data as stored in a second buffer using both said row corrections and said column corrections, wherein said first data as written into said first buffer after said row error correction information has been applied matches said first data as written into said second buffer after generation of all of said row corrections and said column corrections; and
    (J) generating an output signal carrying said corrected data.

2. The method according to claim 1, further comprising the step of:
    writing a plurality of rows from said first block in said first buffer substantially simultaneously with said calculating of said first row syndromes.

3. The method according to claim 1, wherein step (F) comprises the sub-steps of:
    saving said column correction results in said local memory; and
    saving said row correction results in said local memory.

4. The method according to claim 1, further comprising the step of:
    generating a plurality of row erasure locator polynomials in response to decoding said first row syndromes.

5. The method according to claim 4, further comprising the step of:
    generating a plurality of column erasure locator polynomials in response to decoding said first column syndromes.

6. The method according to claim 1, wherein said decoding in said sequence alternating between said first pass and said second pass repeats until an iteration counter reaches a predetermined limit.

7. The method according to claim 1, further comprising the step of:
    calculating a plurality of second row syndromes from a second block of second data arranged as said Reed-Solomon product code while decoding said first block in said sequence alternating between said first pass and said second pass.

8. The method according to claim 7, further comprising the step of:
    storing in a local memory substantially simultaneously all of (i) said second row syndromes, (ii) said second column syndromes, (iii) said first row syndromes and (iv) said first column syndromes.

9. The method according to claim 8, further comprising the step of:
    writing said second row syndromes of said second block into said local memory substantially simultaneously with said updating of said first row syndromes and said first column syndromes of said first block as stored in said local memory.

10. The method according to claim 1, wherein said decoding in said sequence alternating between said first pass and said second pass repeats until an erasure decoding is used.

11. A circuit comprising:
    a row syndrome module configured to calculate a plurality of first row syndromes from a first block of first data arranged as a Reed-Solomon product code and received from a source at an input of said circuit;
    a buffering module configured to (i) store said first data as received at said input in a first buffer and (ii) apply row error correction information to said first data as stored, wherein said first buffer holds at most a first fraction of said first block;
    a column syndrome module configured to calculate an initial set of values of a plurality of first column syndromes from said first block as read from said first buffer after said row error correction information has been applied;
    a local memory coupled to said row syndrome module and said column syndrome module, said local memory configured to (i) store both said first row syndromes and said first column syndromes of said first block;
    a decoder module configured to (a) generate said row error correction information by decoding said first row syndromes (b) decode in a sequence alternating between a first pass and a second pass, wherein (i) said first pass comprises decoding using only said first column syndromes to generate column correction results and (ii) said second pass comprises decoding using only said first row syndromes to generate row correction results and (c) generate both a plurality of row corrections and a plurality of column corrections in response to said first row syndromes and said first column syndromes and to store row corrections and column corrections in the local memory;
    a dispatcher module configured to dispatch first row syndromes and/or first column syndromes from the local memory periodically to the decoder module;
    a delta syndrome module configured to (i) update said first row syndromes in response to said column correction results stored in local memory and (ii) update said first column syndromes in response to said row correction results; and
    a correction module configured to (i) store said first data a second buffer, (ii) generate corrected data by correcting said first data as stored in said second buffer using both said row corrections and said column corrections and (iii) generate an output signal carrying said corrected data, wherein said first data as written into said first buffer after said row error correction information has been applied matches said first data as written into said second buffer after generation of all of said row corrections and said column corrections.

12. The circuit according to claim 11, wherein said buffering module is further configured to present said first data to both an output of said circuit and said column syndrome module (i) after said row error correction information has been applied and (ii) before decoding in said sequence alternating between said first pass and said second pass.

13. The circuit according to claim 12, further comprising an external memory (i) coupled to both said output and said correction module, (ii) independent of said source and (iii) configured to store said first block as received from said first buffer (a) after said row error correction information has been applied and (b) before said first data is corrected in said correction module.

14. The circuit according to claim 11, wherein said local memory is further configured to store both a plurality of second row syndromes and a plurality of second column syndromes of a second block of second data substantially simultaneously with storing said first row syndromes and said first column syndromes of said first block.

15. The circuit according to claim 14, wherein said row syndrome module is further configured to write said second row syndromes of said second block into said local memory substantially simultaneously with said delta syndrome module updating said first row syndromes and said first column syndromes of said first block as stored in said local memory.

16. The circuit according to claim 11, further comprising a dispatcher module connected between said local memory and said decoder module and configured to present a plurality of decode jobs from said local memory to said decode module based on a respective priority of said decode jobs.

17. The circuit according to claim 16, wherein each of said decode jobs comprises one of decoding said first row syndromes and decoding said first column syndromes.

18. The circuit according to claim 11, wherein a plurality of rows from said first block are written into said first buffer substantially simultaneously with said row syndrome module calculating said first row syndromes.

19. A circuit comprising:
row syndrome means for calculating a plurality of first row syndromes from a first block of first data arranged as a Reed-Solomon product code and received from a source at an input of said circuit;
means for (i) storing said first data as received at said input in a first buffer and (ii) applying row error correction information to said first data as stored, wherein said first buffer holds at most a first fraction of said first block;
column syndrome means for calculating an initial set of values of a plurality of first column syndromes from said first block as read from said first buffer after said row error correction information has been applied;
a local memory means coupled to said row syndrome means and said column syndrome means, said local memory means configured to (i) store both said first row syndromes and said first column syndromes of said first block;
a decoding means for (a) generating said row error correction information by decoding said first row syndromes (b) decoding in a sequence alternating between a first pass and a second pass, wherein (i) said first pass comprises decoding using only said first column syndromes to generate column correction results and (ii) said second pass comprises decoding using only said first row syndromes to generate row correction results and (c) generate both a plurality of row corrections and a plurality of column corrections in response to said first row syndromes and said first column syndromes;
a means for dispatching first row syndromes and/or first column syndromes from the local memory means periodically to the decoder means;
means for (i) updating said first row syndromes in response to said column correction results stored in local memory means and (ii) updating said first column syndromes in response to said row correction results and
means for (i) storing said first data in a second buffer, (ii) generating corrected data by correcting said first data as stored in said second buffer using both said row corrections and said column corrections and (iii) generating an output signal carrying said corrected data, wherein said first data as written into said first buffer after said row error correction information has been applied matches said first data as written into said second buffer after generation of all of said row corrections and said column corrections.

* * * * *